Feb. 20, 1962 R. P. MORK 3,022,471

SELF-TUNING FILTER CIRCUITS FOR INCREASING RATIO OF NARROW BAND VARIABLE FREQUENCY SIGNAL TO BROAD BAND NOISE

Original Filed Jan. 26, 1956

INVENTOR
RAYMOND P. MORK
BY Elmer J. Gorn
ATTORNEY 3,022,471

SELF-TUNING FILTER CIRCUITS FOR INCREASING RATIO OF NARROW BAND VARIABLE FREQUENCY SIGNAL TO BROAD BAND NOISE

Raymond P. Mork, Weston, Mass., assignor to Raytheon Company, a corporation of Delaware Continuation of abandoned application Ser. No. 561,448, Jan. 26, 1956. This application July 28, 1961, Ser. No. 129,198
8 Claims. (Cl. 333—17)

This is a continuation of my copending application, Serial No. 561,448, filed January 26, 1956.

This invention relates generally to frequency selective electric wave filters, and more particularly to a novel self-tuning filter circuit which will pass a desired signal occurring within a predetermined frequency range, while substantially rejecting noise which accompanies the applied signal.

In many applications, it is essential to separate a desired signal from accompanying noise. For example, the detected signals in continuous wave radar units consist of an audio frequency sine wave voltage and a substantial amount of noise, which has an approximate uniform power distribution over the received spectrum. Since the sine wave component of this signal, called the doppler signal, is the only part containing useful information, and since it occupies only a narrow band at any particular short period of time, it is possible to increase the sensitivity of the radar and generally improve its performance by passing the signal through a relatively narrow band-pass filter tuned to the frequency of the doppler signal. This filter must be tunable, however, as the frequency of the doppler signal continually varies. Manual tuning is possible but is unreliable without elaborate tuning indicators which are virtually equivalent in complexity to an automatic system.

In accordance with the present invention, an extremely simple and reliable tuning system is provided which automatically tunes itself to the strongest frequency component present in an applied signal. This result is accomplished by providing a plurality of fixed-tuned, band-pass filters, the pass bands of which just overlap to cover the entire spectrum of interest. Following the band-pass filters is a plurality of signal selecting circuits adapted to pass the signal from only the filter whose output voltage is largest. Operation is based on the fact that the frequency of any sine wave signal will fall within the pass band of at least one filter, and the signal will pass through that filter substantially unattenuated, while white noise or pulse noise will have only a small amount of its power falling within the pass band of any filter, so that the noise power allowed to pass through any filter will be small. If there are enough filters, with narrow enough pass bands, a sine wave signal which is submerged in noise at the input to the filter will appear well above noise at the output of one of the filters and the output voltage of this filter will be higher than that of the others owing to the presence of the sine wave signal. Thus, by selecting the output from the filter having the largest output voltage, a signal with greatly reduced noise is obtained.

Figure 1:
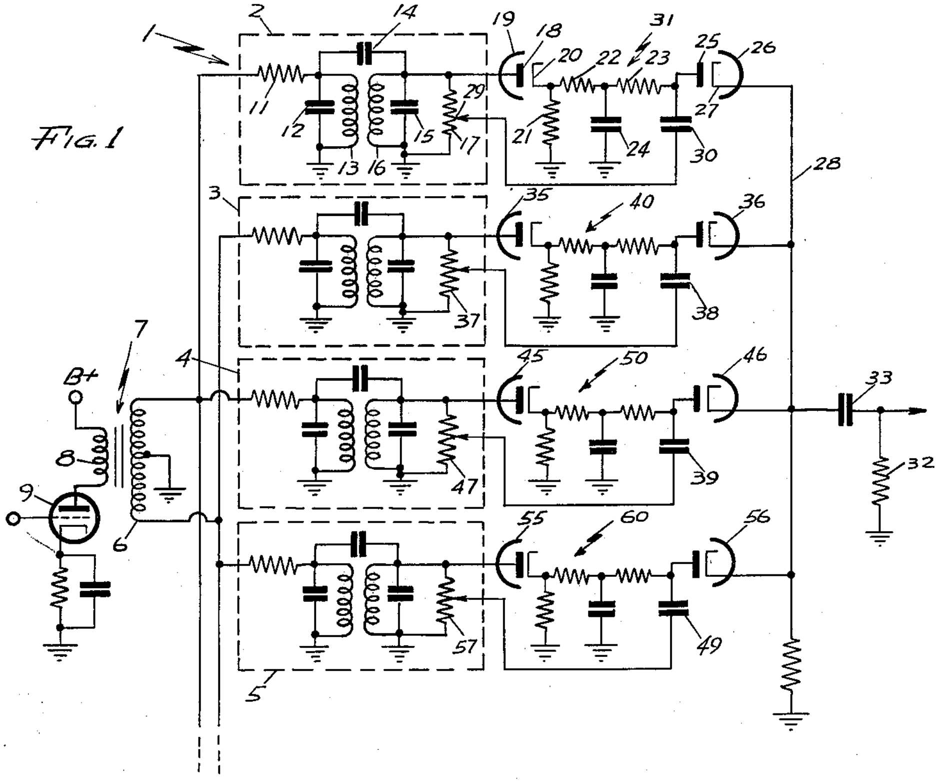
Figure 2:
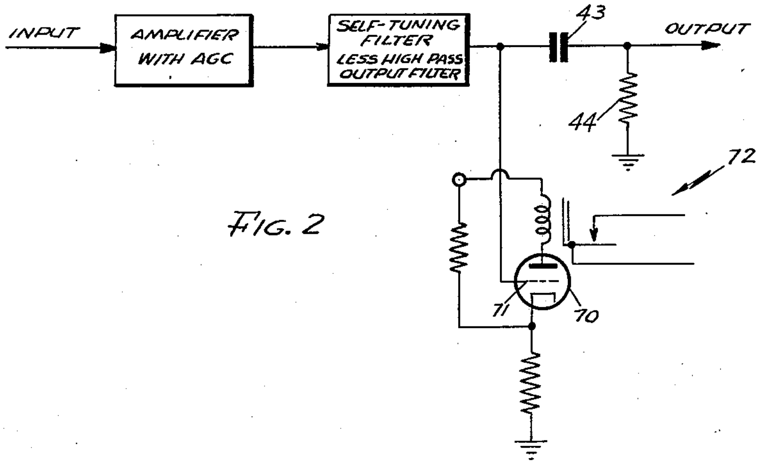

The invention will be better understood as the following description proceeds taken in conjunction with the accompanying drawing wherein:

FIG. 1 is a schematic representation of one embodiment of a filter system in accordance with the present invention; and FIG. 2 is a partially schematic representation of another embodiment of the present invention.

Referring now to the drawings, and more particularly to FIG. 1 thereof, there is shown a self-tuning frequency selective network comprising a plurality of narrow band-pass filters of any desired type shown generally at 1, each of which is indicated as being included within one of the dotted areas 2, 3, 4, and 5. Each of the filters may be designed to pass a desired narrow band of frequencies. For example, in a successfully tested embodiment filter 2 was provided with a pass-band of 1,000 to 1,500 c.p.s., filter 3 with a pass-band of 1,500 to 2,000 c.p.s., filter 4 with a pass-band of 2,000 to 2,500 c.p.s., and filter 5 a pass-band of 2,500 to 3,000 c.p.s. It should be understood that although only four such filters are shown in FIG. 1, any number of additional similar filters may be added in parallel relation to the filters shown at 2, 3, 4, and 5 in order to extend the frequency range as desired, thus obtaining very high sensitivity without increasing basic complexity.

As shown, the filter 2 may comprise a resistor 11 having one end connected to the secondary 6 of transformer 7, and its other end connected to the parallel resonant circuit consisting of capacitor 12 and coil 13. One side of the resonant circuit is connected to ground while the other side is connected through capacitor 14 to one side of a second parallel resonant circuit composed of capacitor 15 and coil 16, the other side of this second resonant circuit also being grounded. Coil 13 and coil 16 should be so arranged that no magnetic coupling exists between them. The filter is completed by an output resistor 17 connected across the second parallel resonant circuit. Since the remaining filters 3, 4, and 5 may be similar in arrangement to that described with reference to filter 2, the only change being in the values assigned to the various components in order to provide the particular pass-band desired, it is deemed unnecessary to repeat the foregoing description as applied to each of the filters 3, 4 and 5. For a purpose to be later explained, adjacent filters have their inputs connected to opposite ends of the secondary 6 of input transformer 7, as shown in the drawing.

Output resistor 17 is connected to a suitable rectifying element, such as to the anode 18 of a diode 19. The cathode 20 of diode 19 is in turn connected through a smoothing network comprising resistors 21, 22, and 23, and a capacitor 24, to the anode 25 of a second diode 26 which functions as a signal-selecting element. Cathode 27 of diode 26 is connected to a common bus line 28. Output resistor 17 is tapped at a suitable point 29, and connected through capacitor 30 to the anode 25 of the signal-selecting diode 26.

Similarly, the remaining filters 3, 4 and 5, and any additional ones which may be included, are each connected to the common bus 28 through corresponding rectifying elements 35, 45, and 55, associated smoothing networks designated generally at 40, 50 and 60, and corresponding signal-selecting elements 36, 46, and 56. Output resistors 37, 47, and 57, are also tapped at a suitable point and connected to their corresponding signal-selecting diodes 36, 46 and 56 through coupling capacitors 38, 39 and 49, respectively.

In order to apply an incoming signal to the system, each of the filters is connected to the secondary winding 6 of an input transformer 7, the secondary 6 being center tapped to ground. Although not necessary to the invention, if signal amplification is required, it may be achieved by including the primary 8 of transformer 7 in the plate circuit of a power amplifier such as a vacuum tube 9.

As previously recited, when the circuit is in operation, the frequency of any sine wave signal applied to input transformer 7 will fall within the pass-band of at least one of the filters 2, 3, 4, and 5 and will pass through that filter unattenuated. The output voltage developed across output resistors 17, 37, 47 and 57 of each of the filters is rectified by the corresponding diode 19, 35, 45, or 55 and each signal is passed through the low-pass smoothing network 31, 40, 50 and 60 following each of these diodes to obtain a plurality of direct voltages proportional to the average output voltage of each of the filters 2, 3, 4 and 5. The direct voltage from each rectifying element is applied to its corresponding selecting diode 26, 36, 46 and 56, the cathodes of which are connected to the common bus 28. The selecting diode to which the highest direct voltage is applied conducts, and the cathode bus 28 rises to this voltage, thereby cutting off the remaining selecting diodes. As shown, a portion of the alternating current signal developed across each of output resistors 17, 37, 47 and 57 is fed through its respective coupling capacitor 30, 38, 39 or 49 to the anode of its corresponding selecting diode 26, 36, 46 or 56, and passes through the diode to the cathode bus 28 if the diode is in a conducting state, but is blocked if the diode is cut off. A simple resistance capacitance high pass filter comprising resistor 32 and capacitor 33 is included to remove the D.C. voltage component from the output signal.

The time constants of the low-pass filters 31, 40, 50 and 60 may be made long enough to allow the selecting circuit carrying the desired signal to remain open through a brief fade of the signal. The noise passed during this period will be centered approximately about the frequencies of the desired signal before the fade, and the noise will, therefore, serve to give an approximate indication of the frequency of the faded signal. The long time constant in the low-pass filters will also prevent short bursts of interfering signals from taking over control of the system.

In some cases the frequency of the desired signal may be such as to produce approximately equal outputs from two adjacent band-pass filters, both of the corresponding diode selectors being open at the same time, depending on how sharply the diode cuts off and on how high a voltage level is used. In this event, the signals from the two filters should be of a proper phase to add constructively, or at least there should be no destructive interference. Since one signal appears near the high end of the pass-band of one of the filters, and the other near the low end of the pass-band of the adjacent filter, the former generally will have a lagging phase and the latter a leading phase. These phase shifts can amount to as much as 90°, and the signals could cancel if the filters were driven in the same phase. In order to avoid this possibility, every other filter is driven with a voltage 180° out of phase by connecting them to opposite ends of the center-tapped secondary 6 of input transformer 7. This arrangement obviates the foregoing problem and further eliminates any sudden reversal in phase as the signal passes one filter to the adjacent one.

In FIG. 2 there is shown a further embodiment of the present invention which may be utilized where an amplifier with automatic gain control designed to hold the noise plus signal power level substantially constant at a predetermined value over a wide band is provided ahead of the self-tuning filter. The noise power admitted by the automatic gain control is divided by the narrow band-pass filters into a plurality of smaller, equal-power narrow-band components. As long as the noise spectrum is flat, each of the narrow band filters ($n$ in number) deals with $$\frac{1}{n}$$

times the total noise power admitted by the automatic gain control. When the noise spectrum is not flat, as is the case when a signal is present, the output from the self-tuning filter may rise to as much as $n$ times the normal (noise only) output because the signal "heaps up" into only one of the $n$ filters, this limit being approached when the signal-to-noise ratio approaches infinity. An amplitude detector, such as a triode 70 having its grid 71 connected ahead of the high pass output filter composed of capacitor 43 and resistor 44, may be provided in order to give an indication of the presence or absence of a desired signal. The system may be designed so that the voltage level appearing at the output of the self-tuning filter will not be high enough to overcome the bias voltage applied to normally cut-off tube 70. However, with the passage of a coherent signal through one of the narrow band filters, tube 70 will be caused to conduct, thus energizing relay 72 to indicate the presence of the coherent signal.

Although there have been described what are considered to be preferred embodiments of the present invention, various adaptations and modifications thereof may be made without departing from the spirit and scope of the invention as defined in the appended claims.

What is claimed is:

1. A frequency-selective network comprising a signal input section, a plurality of narrow band-pass filters interconnected to embrace a predetermined spectrum composed of contiguous frequency ranges, said filters being connected to said input section and adapted to pass a total signal composed of a primary signal of a variable frequency and a plurality of frequency dependent noise components of various strengths, and means connected respectively to each of said filters and responsive to the strongest frequency component of said total signal for selecting the substantially strongest frequency component of said total signal passed by said filters and passing substantially only said strongest frequency component of said total signal to an output circuit.

2. A frequency-selective network comprising a signal input section, a plurality of parallel-connected narrow band-pass filters interconnected to embrace a predetermined spectrum composed of contiguous frequency ranges, said filters being connected to said input section and adapted to pass a total signal composed of a primary signal of a variable frequency and a plurality of frequency dependent noise components of various strengths, and means connected respectively to each of said filters and responsive to the strongest frequency component of said total signal passed by said filters and passing substantially only said strongest frequency component of said total to an output circuit.

3. A frequency-selective network comprising a signal input section, a plurality of parallel-connected, fixed-tuned narrow band-pass filters interconnected to embrace a predetermined spectrum composed of contiguous frequency ranges, said filters being connected to said input section and adapted to pass a total signal composed of a primary signal of a variable frequency and a plurality of frequency dependent noise components of various strengths, and means connected respectively to each of said filters and responsive to the strongest frequency component of said total signal for selecting the substantially strongest frequency component of said total signal passed by said filters and passing substantially only said strongest frequency component of said total signal to an output circuit.

4. A frequency-selective network comprising a signal input section, a plurality of parallel-connected narrow band-pass filters interconnected to embrace a predetermined spectrum composed of contiguous frequency ranges, each of said filters having a different and adjacent pass band, said filters being connected to said input section and adapted to provide frequency dependent output voltages of various strengths, and means responsive to the output voltage of the filter passing the largest output voltage for passing an intelligence signal to an output circuit.

5. A frequency-selective network comprising a signal input section, a plurality of parallel-connected narrow band-pass filters interconnected so as to embrace a spectrum composed of contiguous frequency ranges, each of said filters having a different pass band and being adapted to provide frequency dependent output voltages of various strengths, said filters being connected to said input section, means for splitting the output voltage of each of said filters into a direct current portion and an alternating current portion, and means connected respectively to each of said filters and responsive to the substantially highest direct current voltage emanating from said filters for passing its associated alternating current signal to an output circuit.

6. A frequency-selective network comprising a signal input section, a plurality of parallel-connected narrow band-pass filters interconnected to embrace a predetermined spectrum composed of contiguous frequency ranges, each of said filters having different pass bands with alternate ones of said filters being connected to opposite ends of the secondary winding of an input transformer contained in said input section, rectifying means connected to each of said filters, selecting means connected to said rectifying means, and means connected between said rectifying means and said selecting means for passing an alternating current signal associated with the strongest rectified voltage to an output circuit.

7. A frequency-selective network comprising a signal input section, means for establishing a predetermined noise power level connected to said input section, a plurality of parallel-connected narrow band-pass filters interconnected to embrace a predetermined spectrum composed of contiguous frequency ranges, said filters having different pass bands and being adapted to provide a plurality of frequency dependent noise components of various strengths, said filters being further connected to said establishing means, selecting means connected to said filters and responsive to the substantially strongest signal emanating from said filters, and indicating means responsive to the signal passed by said selecting means and adapted to indicate the presence of said signal when it lies above said predetermined power level.

8. A frequency-selective network comprising a signal input section, a plurality of narrow band-pass filters connected to embrace a predetermined spectrum composed of contiguous frequency ranges, said filters being connected to said input section, rectifying means connected to each of said filters for applying a frequency dependent direct voltage to a selecting means, a smoothing network connected between said rectifying means and said selecting means, and means connected between said filters and said selecting means for passing a portion of an alternating current signal from said filters to said selecting means, said selecting means being responsive to the substantially highest voltage emanating from said filters for passing said alternating current signal to an output circuit.

References Cited in the file of this patent

UNITED STATES PATENTS

| | | |
|---|---|---|
| 1,968,460 | Llewellyn | July 31, 1934 |
| 2,269,011 | Dallos | Jan. 6, 1942 |
| 2,570,431 | Crosby | Oct. 9, 1951 |
| 2,771,586 | Di Toro | Nov. 20, 1956 |
| 2,848,713 | Cowart et al. | Aug. 19, 1958 |

UNITED STATES PATENT OFFICE

CERTIFICATE OF CORRECTION

Patent No. 3,022,471 February 20, 1962

Raymond P. Mork

It is hereby certified that error appears in the above numbered patent requiring correction and that the said Letters Patent should read as corrected below.

Column 4, line 39, after "signal" insert -- for selecting the substantially strongest frequency component of said total signal --.

Signed and sealed this 19th day of June 1962.

(SEAL)
Attest:

ERNEST W. SWIDER
Attesting Officer

DAVID L. LADD
Commissioner of Patents